United States Patent
Tao et al.

(10) Patent No.: US 9,508,927 B1
(45) Date of Patent: Nov. 29, 2016

(54) PHASE CHANGE MEMORY HAVING A FUNNEL-SHAPED HEATER AND METHOD OF MANUFACTURING THE SAME

(71) Applicants: Ningbo Advanced Memory Technology Corporation, Ningbo (CN); Being Advanced Memory Taiwan Limited, Hsinchu County (TW)

(72) Inventors: Yi-Fang Tao, Hsinchu County (TW); Yu-Jen Lin, Hsinchu County (TW)

(73) Assignees: Ningbo Advanced Memory Technology Corporation, Ningbo (CN); Being Advanced Memory Taiwan Limited, Hsinchu County (TW)

( * ) Notice: Subject to any disclaimer, the term of this patent is extended or adjusted under 35 U.S.C. 154(b) by 0 days.

(21) Appl. No.: 14/986,732

(22) Filed: Jan. 4, 2016

(30) Foreign Application Priority Data

Sep. 9, 2015 (CN) .......................... 2015 1 0570548

(51) Int. Cl.
  *H01L 45/00* (2006.01)
(52) U.S. Cl.
  CPC ............. *H01L 45/06* (2013.01); *H01L 45/126* (2013.01); *H01L 45/1233* (2013.01); *H01L 45/1608* (2013.01); *H01L 45/1675* (2013.01)

(58) Field of Classification Search
  CPC . H01L 45/06; H01L 45/1233; H01L 45/124; H01L 45/126
  See application file for complete search history.

(56) References Cited

U.S. PATENT DOCUMENTS

| | | | |
|---|---|---|---|
| 8,410,607 B2 * | 4/2013 | Shue .................. | G11C 11/5678 257/758 |
| 2010/0096610 A1 * | 4/2010 | Wang ................. | H01L 27/2409 257/2 |
| 2014/0158971 A1 * | 6/2014 | Lam ....................... | H01L 45/06 257/4 |

* cited by examiner

*Primary Examiner* — Jose R Diaz
(74) *Attorney, Agent, or Firm* — CKC & Partners Co., Ltd.

(57) ABSTRACT

A method of manufacturing a phase change memory includes: (i) forming a first dielectric layer, a conductive contact and a first electrode over a semiconductor substrate; (ii) forming a second dielectric layer having an opening over the first dielectric layer, the opening exposing a top surface of the first electrode; (iii) forming a barrier layer lining a sidewall of the opening; (iv) forming a phase change element in the opening, wherein the phase change element includes a base and a peripheral wall extending upwards along the barrier layer from a periphery of the base, and an inner side of the peripheral wall defines a recess having an inlet and a bottom portion; (v) forming a heater filled in the recess; and (vi) forming a second electrode over the heater. A phase change memory is disclosed herein as well.

15 Claims, 10 Drawing Sheets

US 9,508,927 B1

PHASE CHANGE MEMORY HAVING A FUNNEL-SHAPED HEATER AND METHOD OF MANUFACTURING THE SAME

PRIORITY CLAIM AND CROSS-REFERENCE

This application claims priority to Chinese Application Ser. No. 201510570548.4, filed Sep. 9, 2015, which is herein incorporated by reference.

BACKGROUND

Technical Field

The present disclosure relates to a phase change memory and a method of manufacturing the phase change memory.

Description of Related Art

Computers or other electronic devices are usually equipped with various types of memory devices, such as random access memory (RAM) devices, read only memory (ROM) devices, dynamic random access memory (DRAM) devices, synchronous dynamic random access memory (SDRAM) devices, phase change random access memory (PCRAM) devices, or flash memory devices. Phase-change memory devices are non-volatile memory devices, and the data stored therein may be acquired by measuring the resistance of the memory units. In general, each phase-change memory unit includes a heating element and a phase-change unit. When the phase-change unit is heated, a phase change phenomenon occurs therein. When current is applied to the heating element, the heating element converts electrical energy into heat. The generated heat prompts the occurrence of the phase change in the phase-change unit, for example from an amorphous phase into a polycrystalline phase. The phase change unit has different resistances in different phases. The data stored therein may be determined by measuring or reading the resistance of each phase-change unit. It is always an important target to simplify the method of manufacturing phase-change memory devices for memory device manufacturers.

SUMMARY

According to one aspect of the present disclosure, a method of manufacturing a phase change memory is provided. The method provided herein is advantageous in that only a single photolithography etching process is required to form a phase change element with a special shape in the dielectric layer and a heater embedded in the phase change element. The method includes operations of: (i) forming a first dielectric layer, at least one conductive contact and at least one first electrode over a semiconductor substrate, wherein the first electrode is stacked on the conductive contact, and the first electrode has a top surface exposed from the first dielectric layer; (ii) forming a second dielectric layer having at least one opening over the first dielectric layer, the opening exposing the top surface of the first electrode; (iii) forming a barrier layer lining a sidewall of the opening; (iv) forming a phase change element in the opening, wherein the phase change element includes a base in contact with the top surface of the first electrode and a peripheral wall extending upwards from a periphery of the base along the barrier layer, an inner side of the peripheral wall defines a recess, and a width of an inlet of the recess is greater than a width of the bottom portion of the recess; (v) forming a heater filled in the recess, wherein the heater has an upper portion and a lower portion, and the upper portion has a width greater than a width of the lower portion; and (vi) forming a second electrode over the heater.

In some embodiments of the present disclosure, the operation of forming the barrier layer lining the sidewall of the opening includes: depositing a barrier material layer over the second dielectric layer, the sidewall and the top surface of the first electrode; and removing portions of the barrier material layer deposited on the second dielectric layer and on the top surface.

In some embodiments of the present disclosure, the operation of forming the phase change element in the opening includes: depositing a phase change material layer in the opening and over the second dielectric layer, wherein the phase change material layer envelops a hollow space in the opening; removing the phase change material layer deposited over the second dielectric layer; and etching away a portion of the phase change material layer in the opening to expose the hollow space, thereby forming the recess.

In some embodiments of the present disclosure, the width of the inlet of the recess is ranged from about 30 nm to about 100 nm, and the width of the bottom portion of the recess is ranged from about 12 nm to about 30 nm.

In some embodiments of the present disclosure, a ratio of the width of the inlet of the recess to the width of the bottom portion of the recess is about 1.2 to about 9.

In some embodiments of the present disclosure, a depth of the recess is defined by a distance from the inlet of the recess to the bottom portion of the recess, and the depth is ranged from 30 nm to 70 nm.

In some embodiments of the present disclosure, the width of the upper portion of the heater equals the width of the inlet of the recess, and the width of the lower portion the heater equals the width of the bottom portion of the recess.

In some embodiments of the present disclosure, the operation of forming the heater includes forming an auxiliary electrode, wherein the auxiliary electrode is extended from the upper portion of the heater and has a width the same as a width of the upper portion.

In some embodiments of the present disclosure, the operation of forming the second electrode includes: forming a third dielectric layer over the heater, wherein the third dielectric layer has a first aperture exposing the heater; and forming the second electrode in the first aperture.

According to another aspect of the present disclosure, a phase change memory is provided. The phase change memory includes a first electrode, a phase change element, a heater and a second electrode. The phase change element includes a base and a peripheral wall. The base is in contact with the first electrode, and the peripheral wall is extended upwards from a periphery of the base. The peripheral wall has an inner side defining a recess having an inlet and a bottom portion, and a width of the inlet is greater than a width of the bottom portion. The heater is embedded in the recess. The heater includes an upper portion and a lower portion. A width of the upper portion is equal to the width of the inlet of the recess, and a width of the lower portion is equal to the width of the bottom portion of the recess. The second electrode is positioned over the heater.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
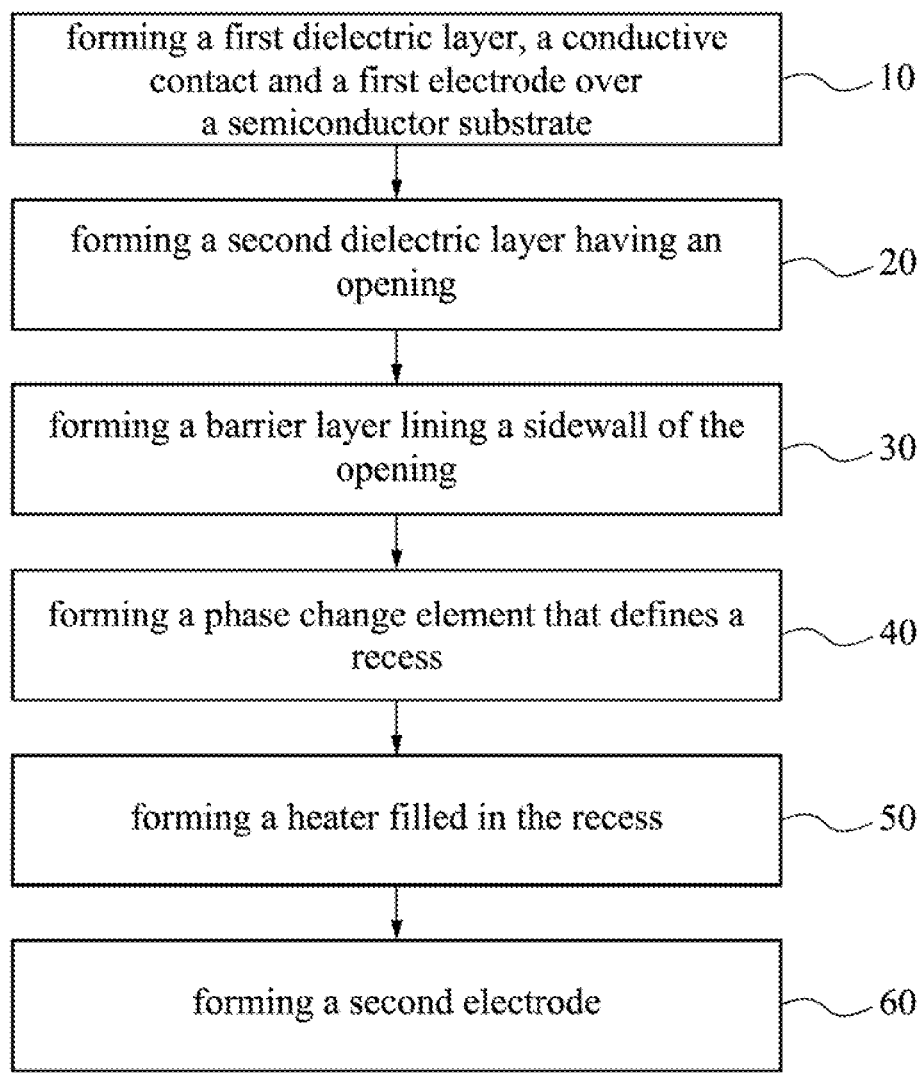
FIG. 1A is a flowchart illustrating a method of manufacturing a phase change memory according various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

According to one aspect of the present disclosure, a method of manufacturing a phase change memory is provided. FIG. 1A is a flowchart illustrating a method 1 of manufacturing a phase change memory according to various embodiments of the present disclosure. The method 1 includes operation 10, operation 20, operation 30, operation 40, operation 50, and operation 60. FIGS. 2A to 12 are drawings, in portion or entirety, at various stages of fabrication during operations 10-60. It will be appreciated that although these methods each illustrate a number of operations, acts and/or features, not all of these operations, acts and/or features are necessarily required, and other un-illustrated operations, acts and/or features may also be present. Also, the order of the operations and/or acts in some embodiments can vary from what is illustrated in these figures. In addition, the illustrated operations and/or acts can be further divided into sub-operations and/or sub-acts in some implementations, while in other implementations some of the illustrated acts can be carried out concurrently with one another.

Figure 2A:
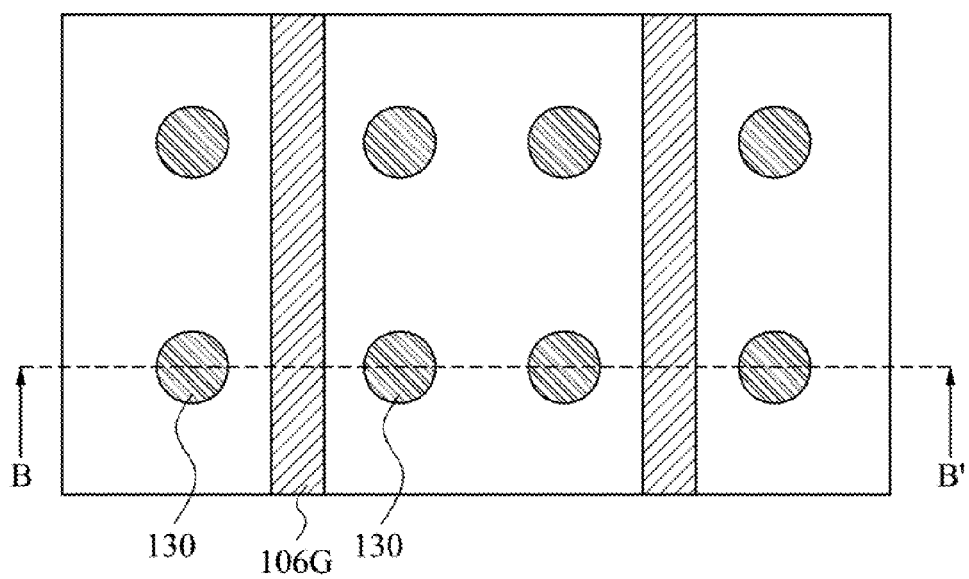
FIG. 2A is a top view schematically illustrating a structure after performing operation 10 according to some embodiments of the present disclosure.
Figure 2B:
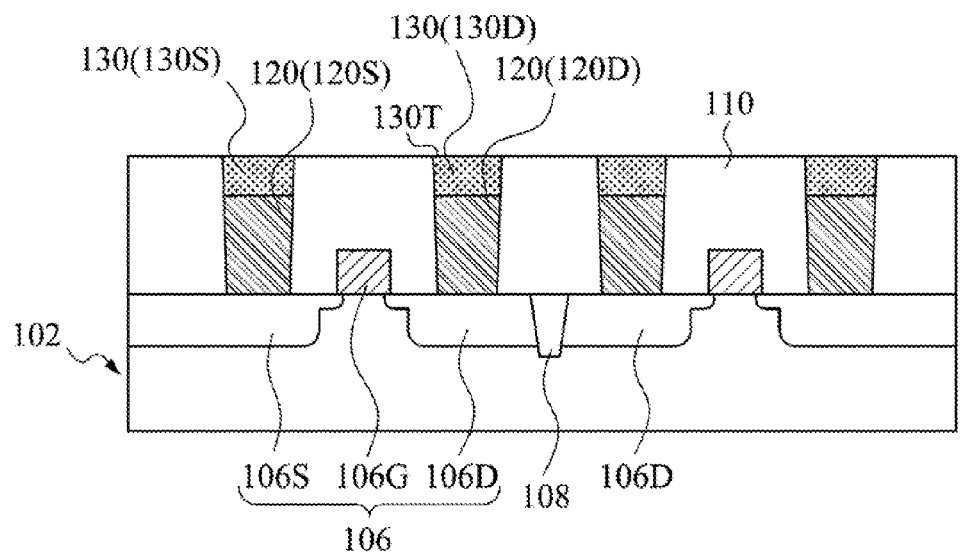
FIG. 2B schematically depicts a cross-sectional view taken along line BB' in FIG. 2A.

In operation 10, a first dielectric layer, at least one conductive contact and at least one first electrode are formed over a semiconductor substrate. FIG. 2A is a top view schematically illustrating an obtained structure after performing operation 10 according to some embodiments of the present disclosure. FIG. 2B schematically depicts a cross-sectional view taken along line BB' in FIG. 2A. As shown in FIGS. 2A and 2B, a first dielectric layer 110, a plurality of conductive contacts 120, and a plurality of first electrodes 130 are formed over a semiconductor substrate 102. In some embodiments, the semiconductor substrate 102 includes a doped or untapped silicon wafer, a semiconductor-on-insulator (SOI) substrate, or the like. In some embodiments, the semiconductor substrate 102 further includes an active device 106 such as for example an N-type metal oxide semiconductor (COMES) device, a P-type metal oxide semiconductor (PROS) device, a complementary metal-oxide semiconductor (COMES) device, or the like. In some embodiments, the active device 106 includes a gate electrode 106G, a source region 106S, and a drain region 106D. In some examples, the semiconductor substrate 102 further includes at least one shallow trench isolation (SIT) structure 108 for isolating the drain regions 106D between two adjacent active devices 106.

The dielectric layer 110 may be any suitable dielectric material such as, for example, silicon nitride, silicon oxide, doped silicon glass, and other dielectric materials. Besides, the dielectric layer 110 may be formed of a low-dielectric constant (low k) material such as, for example, phosphorus silicate glass (PEG), boron phosphorous silicon glass (BPSG), fluorinated silica glass (FSG), silicon carbide material, or a combination thereof, or the like.

The conductive contacts 120 may be, for example, metal via contacts which include tungsten (W) or the like. In some embodiments, the conductive contacts 120 include a plurality of source contacts 120S and a plurality of drain contacts 120D. The source contacts 120S are positioned over the source regions 106S and electrically connected to the source regions 106S. The drain contacts 120D are positioned over the drain regions 106D and electrically connected to the drain regions 106D.

Each first electrode 130 is stacked on a corresponding one of the conductive contacts 120, and each first electrode 130 has a top surface 130T exposed out of the first dielectric layer 110. In some embodiments, the first electrodes 130 may be classified into first electrodes 130S formed on the source contacts 120S, and first electrode 130D formed on the drain contacts 120D. The first electrodes 130, for example, may be formed of titanium nitride (TiN), tantalum nitride (TaN), titanium (Ti), aluminum (Al), copper (Cu), silver (Ag), gold (Au), or the like, or a combination thereof. Each of the first electrodes 130 may be a single-layered structure or a multi-layered structure. In some embodiments, the step of forming the first electrode 130 includes sequentially performing a deposition process and a chemical mechanical polishing process. Examples of the deposition process include physical vapor deposition (PVD) processes, chemical vapor deposition (CVD) processes, plasma enhanced chemical vapor deposition (PECVD) processes, atomic layer deposition (ALD) process, atomic layer chemical vapor deposition (ALCVD) process, and/or other suitable blanket deposition techniques.

Figure 3:
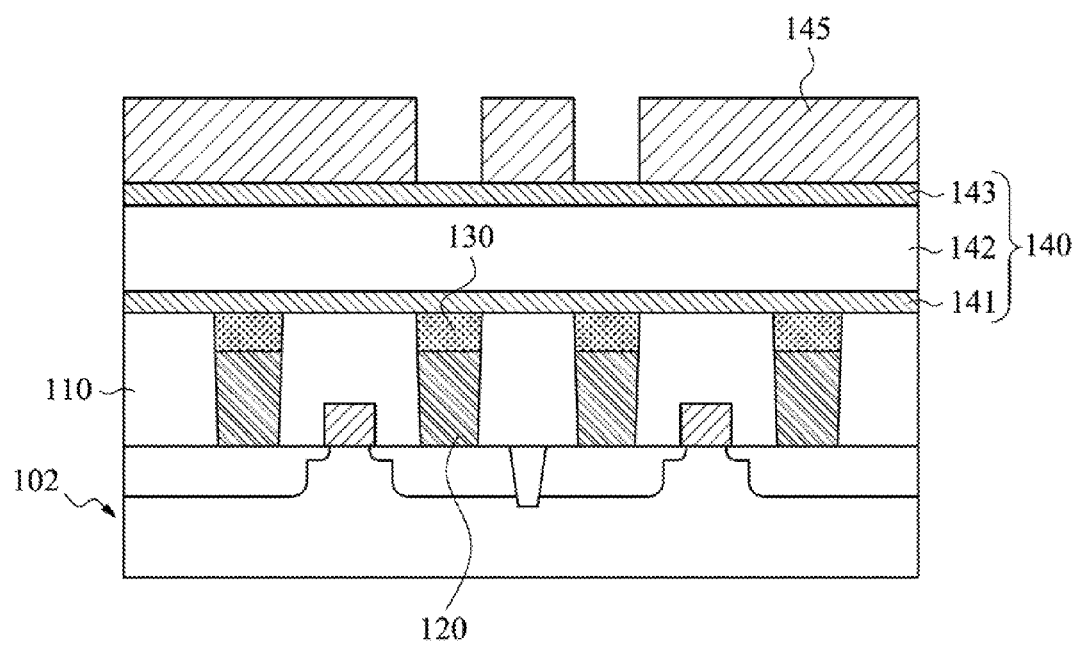
FIGS. 3-12 are cross-sectional views schematically illustrating various process stages according to various embodiments of the present disclosure.
Figure 4:
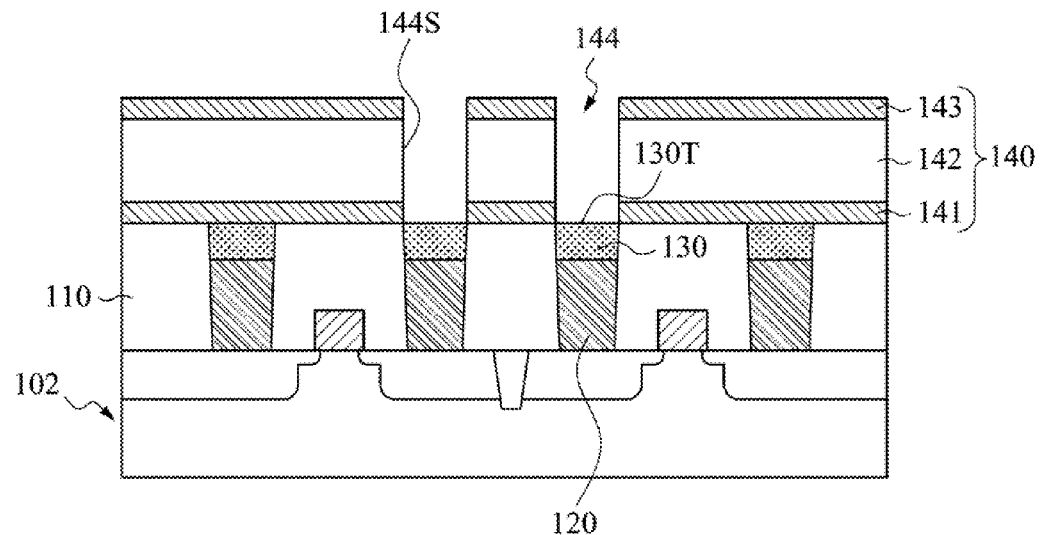

In operation 20, a second dielectric layer with at least one opening is formed over the first dielectric layer, wherein the second dielectric layer may be a single-layered or multiple-layered dielectric. For example, as illustrated in FIG. 3, a dielectric layer 141, a dielectric layer 142, and a dielectric layer 143 are sequentially deposited on the first dielectric layer 110 by using physical vapor deposition or chemical vapor deposition techniques. Then, a patterned masking layer 145 is formed on the second dielectric layer 140. The patterned masking layer 145 may be a positive type photoresist layer or other suitable hard-mask layers. Thereafter, as shown in FIG. 4, the second dielectric layer 140 is etched so as to form an opening 144 in the second dielectric layer 140. The opening 144 is substantially aligned with the first electrode 130, and exposes the top surface 130T of the first electrode 130. In some embodiments, the dielectric layer 141 and the dielectric layer 143, for example, may be formed of silicon nitride or the like. The dielectric layer 142, for example, may be formed of silicon oxide or the like. The dielectric layer 142 is interposed between the dielectric layer 141 and the dielectric layer 143. In some examples, a thickness of the dielectric layer 142 is greater than to thickness of the dielectric layer 141 and/or the dielectric layer 143.

Figure 5:
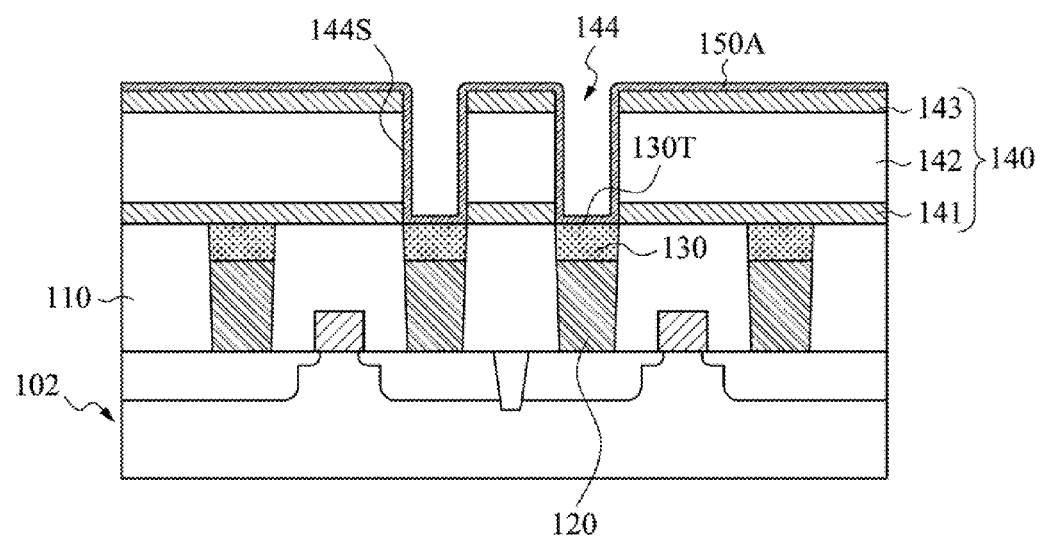
Figure 6:
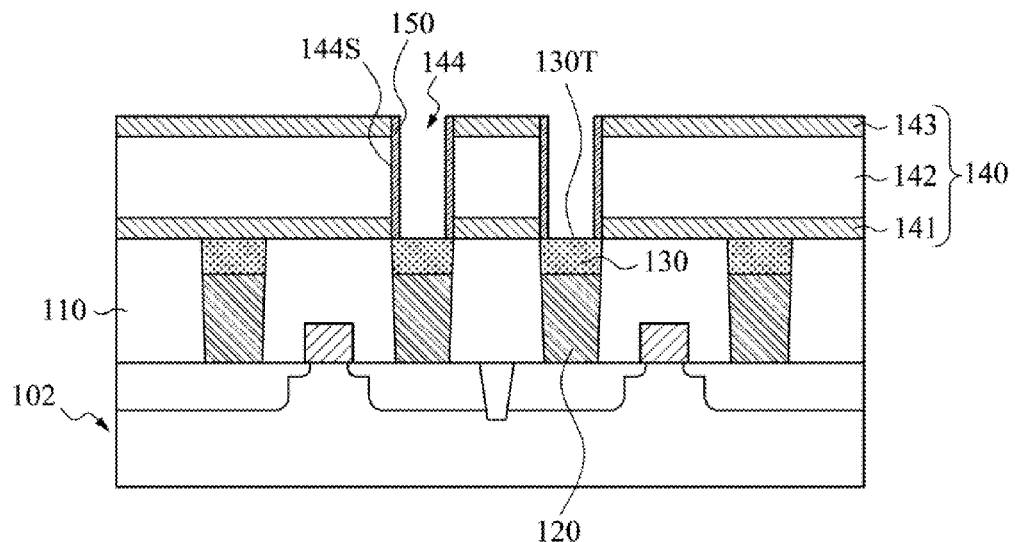

In operation 30, a barrier layer is formed lining a sidewall of the opening. FIG. 5 and FIG. 6 illustrates the detail steps of performing operation 30 according to some embodiments of the present disclosure. As shown in FIG. 5, a barrier material layer 150A is deposited on the second dielectric layer 140 in a blanket manner. The barrier material layer 150A covers the second dielectric layer 140, the sidewall 144S of the opening 144, and the top surface 130T of the first electrode 130. Thereafter, as shown in FIG. 6, the two portions of the barrier material layer 150A, which are respectively disposed over the second dielectric layer 140 and the top surface 130T of the first electrode, are removed by using as anisotropic etching process, thereby forming the barrier layer 150 on the sidewall 144S of the opening 144. Since the nature of the anisotropic etching process, the portion of the barrier material layer deposited on the sidewall 144S of the opening 144 may be retained so as to form the barrier layer 150 lining the sidewall 144S of the opening 144. In some embodiments, the barrier material layer 150A may include a material such as, for example, silicon nitride ($Si_xN_y$), titanium nitride (TiN), tantalum nitride (TaN), or the like, or a combination thereof.

Figure 1B:
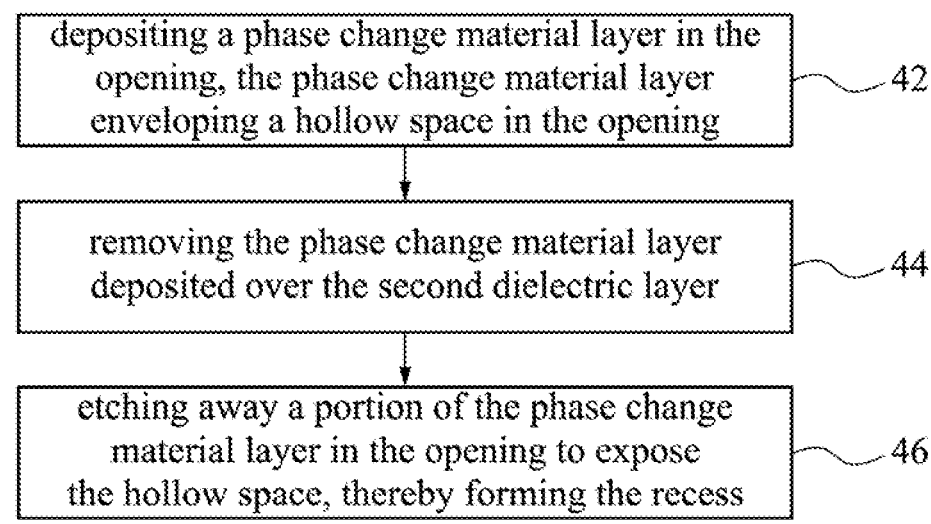
FIG. 1B is a flowchart illustrating an approach to implement operation 40 according to some embodiments of the present disclosure.
Figure 7:
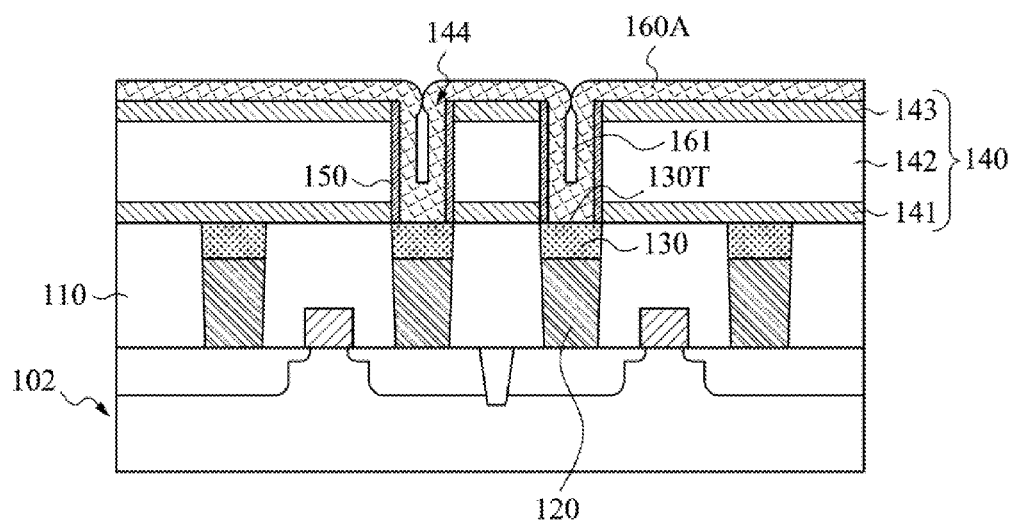
Figure 8:
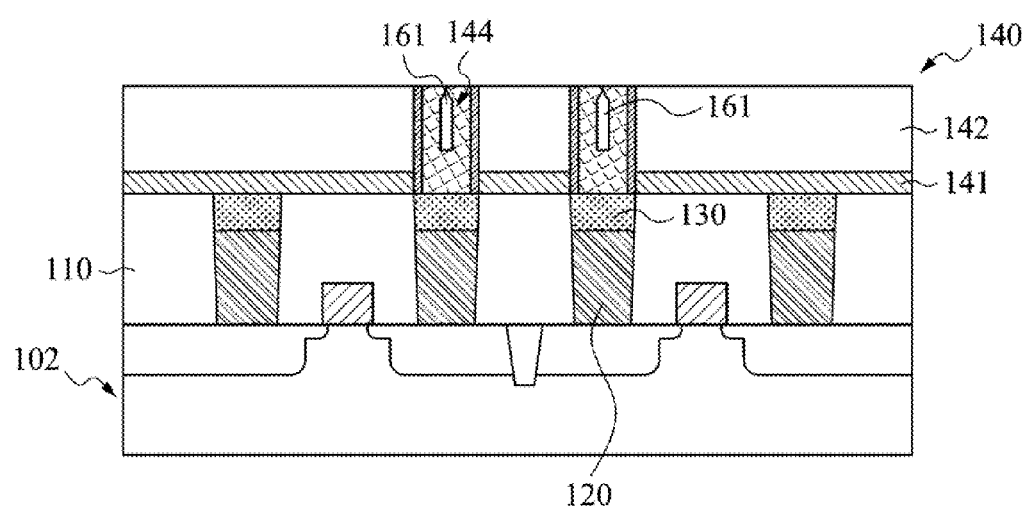
Figure 9A:
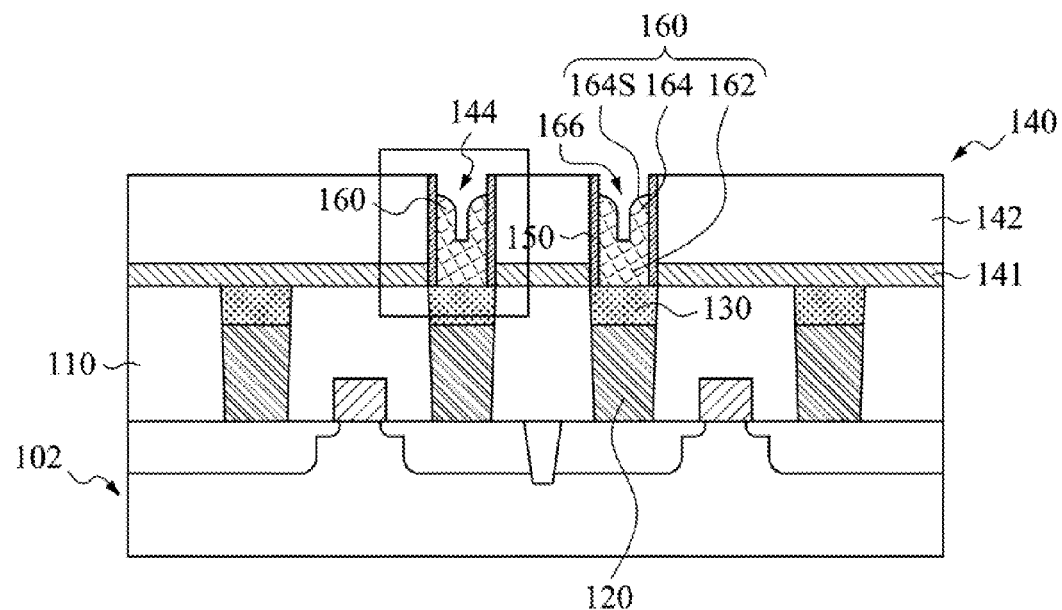

In operation 40, a phase change element is formed. FIG. 1B is a flowchart illustrating detail steps to implement operation 40 according to some embodiments of the present disclosure. It will be appreciated that although the operation 40 are illustrated by a number of step, acts and/or features, not all of these steps, acts and/or features are necessarily required, and other un-illustrated steps, acts and/or features may also be present. Also, the ordering of the steps and/or acts in some embodiments can vary from what is illustrated in these figures. In addition, the illustrated steps and/or acts each can be further divided into sub-steps and/or sub-acts in some implementations, while in other implementations some of the illustrated acts can be concurrently carried out with one another. Referring to FIG. 1B, operation 40 includes step 42, step 44, and step 46. FIGS. 7, 8 and 9A are cross-sectional views, in portion or entirety, schematically illustrating various steps in operation 40.

In step 42, a phase change material layer 160A is deposited in the opening 144 and over the second dielectric layer 140, as shown in FIG. 7. Since the process characteristics of the blanket deposition techniques, the portion of the phase change material layer 160A deposited in the opening 144 envelops a hollow space 161 therein. According to some embodiments, when the width of the opening 144 is less than about 100 nm, and the aperture ratio (i.e., the ratio of the depth to the width of the opening) of the opening 144 is greater than about 0.8, a hollow space 161 may be formed in the opening 144 after the deposition of the phase change material layer 160A. In the hollow space 161, there phase change material layer 160A. In some examples, the width of the opening 144 is about 30-100 nm, and the depth of the opening 144 is about 80-240 nm. In some embodiments, the phase change material layer includes germanium(Ge)—antimony(Sb)—tellurium(Te) (GST) material such as, for example, $Ge_2Sb_2Te_5$, $Ge_1Sb_2Te_4$, $Ge_1Sb_4Te_7$, or the like, or a combination thereof. Other examples of the phase change material include GeTe, $Sb_2Te_3$, GaSb, InSb, Al—Te, Te—Sn—Se, Ge—Sb—Te, In—Sb—Te, Ge—Se—Ga, Bi—Se—Sb, Ga—Se—Te, Sn—Sb—Te, In—Sb—Ge, Te—Ge—Sb—S, Te—Ge—Sn—O, Sb—Te—Bi—Se, Te—Ge—Sn—Au, Pd—Te—Ge—Sn, In—Se—Ti—Co, Ge—Sb—Te—Pd, Ag—In—Sb—Te, Ge—Te—Sn—Pt, Ge—Te—Sn—Ni, Ge—Te—Sn—Pd, and Ge—Sb—Se—Te.

In step 44, the portion of the phase change material layer 160A deposited over the second dielectric layer 140 is removed, as shown in FIG. 8. In some embodiments, the portion of the phase change material layer deposited on the top surface of the second dielectric layer 140 is removed by using a chemical-mechanical polishing (CMP) process. According to one example of the present disclosure, in the chemical-mechanical polishing process, a portion of the dielectric layer is simultaneously removed. For example, the dielectric layer 143 may be removed, whereas the dielectric layer 142 serves as a stop layer so as to obtain a good process control.

In step 46, as shown in FIG. 9A, a portion of the phase change material layer 160A deposited in the opening 144 is etched away so as to expose the hollow space, thereby forming a phase change element 160 and a recess 166. In some embodiments, dry etching processes such as, for example, reactive ion etching (RIE) techniques or other suitable wet etching processes may be employed to implement step 46. Duo to the characteristics of the etching processes, a high etching rate appears at the entrance of the opening 144, and the formed recess 166 therefore has a funnel-shaped profile that is wide at the top and narrow at the bottom. In other words, the obtained phase change element 160 has a special shape, which is described in detail hereinafter.

Figure 9B:
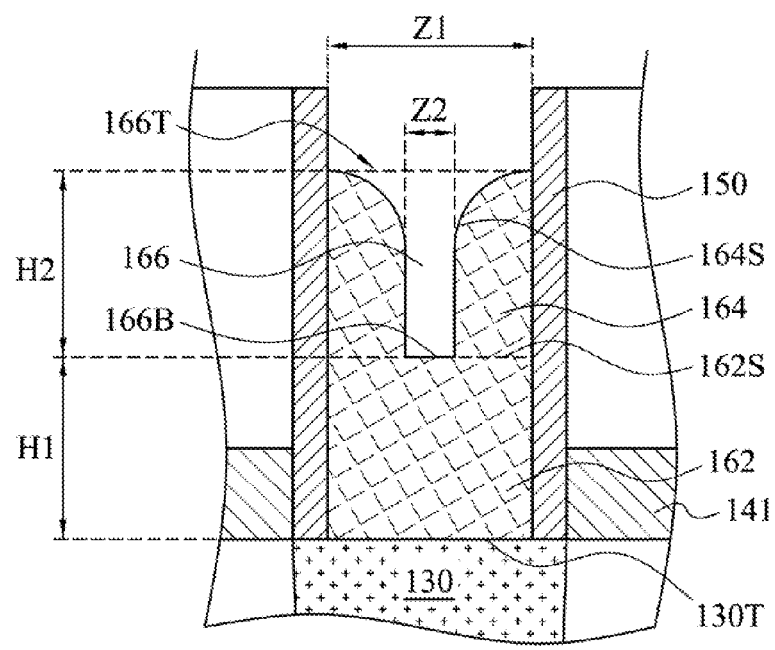

FIG. 9B is an enlarged view showing the phase change element 160 according to sonic embodiments of the present disclosure. The phase change element 160 includes a base 162 and a peripheral wall 164. The base 162 is in contact with the top surface 130T of the first electrode 130. The peripheral wall 164 extends upwards from an edge 162S of the base 162 along the barrier layer 150. An inner side 164S of the peripheral wall 164 defines the shape of the recess 166, and therefore the width Z1 of the inlet 166T of the recess 166 is greater than the width Z2 of the bottom portion 166B of the recess 166. In some examples, the base 162 of the phase change element 160 has a thickness H1 of about 30 nm to about 70 nm. In yet some examples, the width Z1 of the inlet 166T of the recess 166 is about 30 nm to about 100 nm, and the width Z2 of the bottom portion 166B of the recess 166 is about 12 nm to about 30 nm. In some examples, the ratio of the width Z1 of the inlet to the width Z2 of the bottom portion is ranged from about 1.2 to about 9, for example 1.5, 2.0, 3, 5, 7, or 8. In yet some examples, a depth H2 of the recess 166 is defined as from the inlet 166T of the recess 166 to the bottom portion 166B of the recess 166, and the depth H2 is about 30 nm to about 70 nm.

Figure 10:
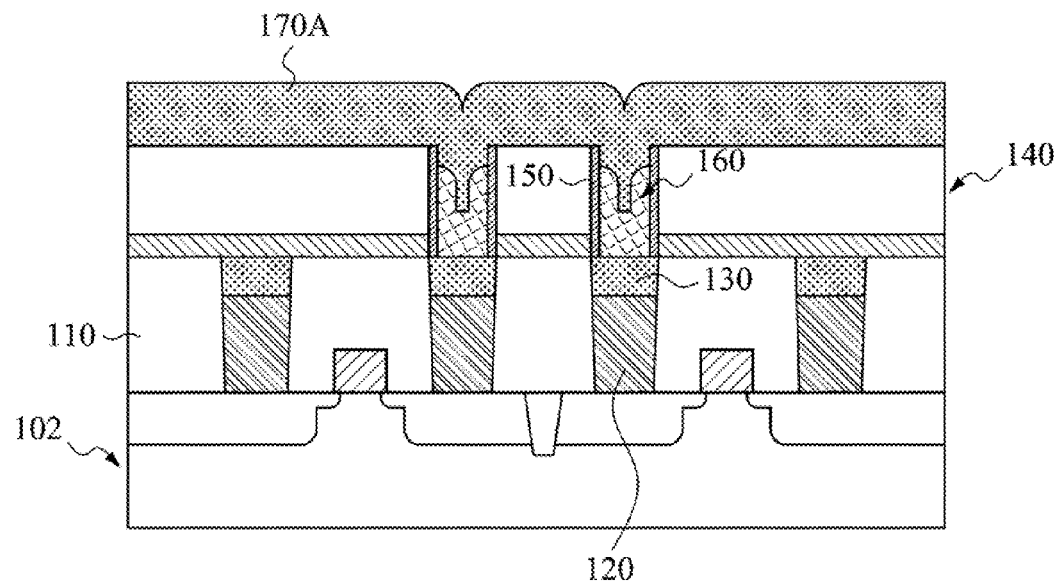
Figure 11:
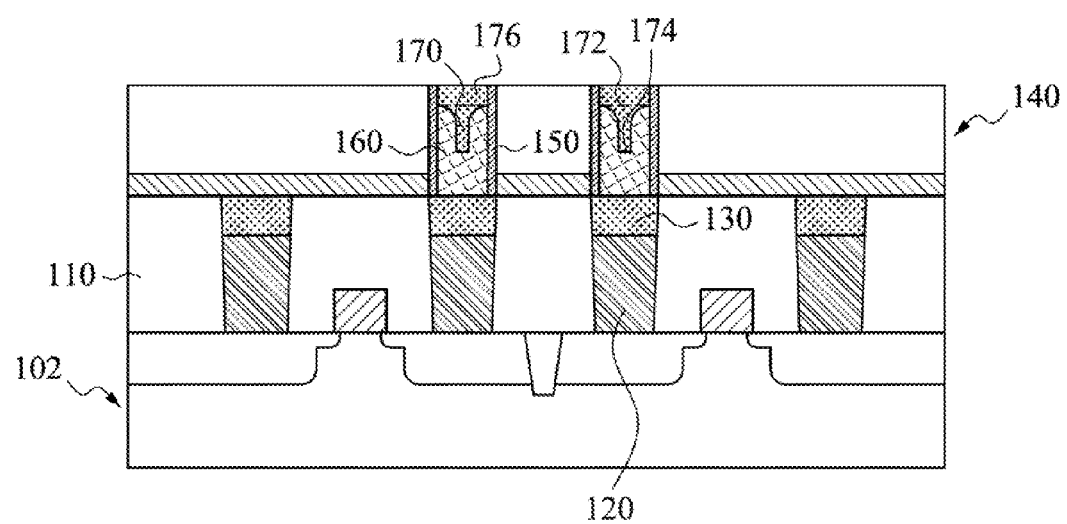

Referring back to FIG. 1A, operation 50 is performed after operation 40. In operation 50, a heater is formed filling the recess. FIG. 10-11 are cross-sectional views schematically illustrating the implementation of operation 50 according to some embodiments of the present disclosure. With reference to FIG. 10, a heating material layer 170A is deposited covering the second dielectric layer 140 and filling the recess 166. Thereafter, as shown in FIG. 11, a portion of the heating material layer 170A deposited over the second dielectric layer 140 is removed, thereby forming the heater 170 embedded in the recess 166. In one example, an upper portion 172 of heater 170 has a width that is substantially equal to the width Z1 (indicated in FIG. 9B) of the inlet 166T of the recess 166. A lower portion 174 of the heater 170 has a width that is substantially equal to the width Z2 (indicated in FIG. 9B) of the bottom portion 166B of the recess 166. Accordingly, the width of the upper portion 172 of the heater 170 is greater than that of the lower portion 174 of the heater 170. In some embodiments, operation 50 further includes forming an auxiliary electrode 176. The auxiliary electrode 176 is extended from the upper portion 172 of the heater 170, and has a width substantially the same as the width of the upper portion 172.

After performing operations 20, 30, 40 and 50, the phase change element 160 and the heater 170 embedded in the phase change element 160 are fabricated. It is noted that in operations 20, 30, 40 and 50, only operation 20 needs to perform a photolithography etching process (referring to FIGS. 3 and 4), whereas operations 30, 40 and 50 do not need any lithography etching process (referring to 5-11). Therefore, only a single photolithography etching process is required to form the phase change element with a special shape in the dielectric layer and the heater embedded in the phase change element. In addition, the obtained heater 170 has a funnel-liked shape. When electric current flows from the upper portion 172 to the lower portion 174 of the heater 170, electric current aggregates to the lower portion 174 with a decreased cross-sectional area, so that the lower portion 174 provides an increased current density (the term "current density" herein refers to the amount of electric current divided by the cross-sectional area through which the electric current passes). The increased current density facilitates the lower portion 174 of the heater 170 to generate a high temperature, and the high temperature accelerates the phase change of the phase change element 160, and accordingly the writing-data speed may be increased. In addition, because the phase change element 160 is surrounded by the barrier layer 150, the first electrode 130 and, the heater 170, this structure may prevent the material of the phase change element 160 from migrating to adjacent dielectric layers due to diffusion phenomena perhaps occurred in the subsequent processes. Furthermore, the barrier layer 150 may keep the heat generated by the heater, and it also facilitates the phase change of the phase change element.

Figure 12:
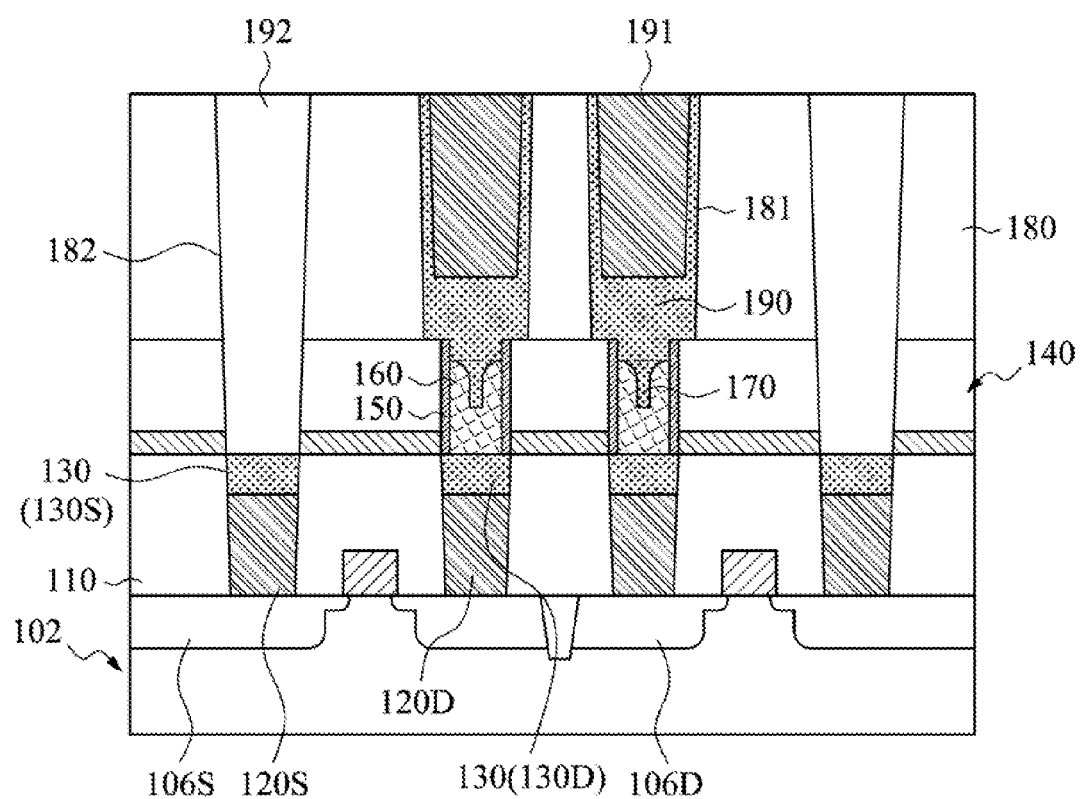

In operation 60, a second electrode is formed over the heater. In some embodiments, as shown in FIG. 12, operation 60 includes firstly forming a third dielectric layer 180 over the heater 170 and the second dielectric layer 140. The third dielectric layer 180 has a first aperture 181 exposing the heater 170. Then, a second electrode 190 is formed in the first aperture 181 such that the second electrode 190 contacts the heater 170 (or auxiliary electrode 176) there under. It is appreciated that there are a number of approaches to form the second electrode 190 over the heater 170. For example, the second electrode may be formed directly on the heater 170 using conventional deposition, photolithography and etching processes, in which the third dielectric layer is not required. Accordingly, the approach of forming the second electrode in the present disclosure is not limited on the steps or methods depicted in FIG. 12.

According to various embodiments of the present disclosure, method 1 may further includes other operations or steps after operation 60. For example, as shown in FIG. 12, one or more second apertures 182 may he formed passing through the third dielectric layer 180 and the second dielectric layer 140 after the formation of the third dielectric layer 180 and the second electrode 190. The second aperture 182 exposes the first electrode 130S over the source contact 120S. Thereafter, a first vertical interconnect structure 191 and a second vertical interconnect structure 192 are formed respectively in the first aperture 181 and the second aperture 182. The first vertical interconnect structure 191 is electrically connected to the drain region 106D through the second electrode 190, the heater 170, the phase change element 160, the first electrode 130D, and drain contact 120D. The second vertical interconnect structure 192 is electrically connected to the source region 106S through the source contact 120S.

According to another aspect of the present disclosure, a phase change memory 200 is provided, as shown in FIG. 12. The phase change memory 200 includes a first electrode 130, a phase change element 160, a heater 170, and a second electrode 190. The phase change element 160 includes a base 162 and a peripheral wall 164 (indicated in FIG. 9B). The base 162 is in contact with the first electrode 130. The peripheral wall 164 extends upwards from a periphery of the base 162. The peripheral wall 164 has an inner side defining a shape of a recess 166. The width Z1 of the inlet 166T of the recess 166 is greater than the width Z2 of the bottom portion 166B of the recess 166. The heater 170 is embedded in the recess 166. The width of the upper portion 172 of the heater 170 is equal to the width Z1 of the inlet 166T of the recess 166, and the width of the lower portion 174 of the heater 170 is equal to the width Z2 of the bottom portion 166B of the recess 166. The second electrode 190 is positioned over the heater.

It will be apparent to those skilled in the art that various modifications and. variations can be made to the structure of the present invention without departing from the scope or spirit of the invention. In view of the foregoing, it is intended that the present invention cover modifications and variations of this invention provided they fall within the scope of the following claims.

What is claimed is:

1. A phase change memory, comprising:
   a first electrode;
   a phase change element comprising:
     a base in contact with the first electrode; and
     a peripheral wall extending upwards from a periphery of the base, wherein the peripheral wall has an inner side defining a recess having an inlet and a bottom portion, and a width of the inlet is greater than a width of the bottom portion;
   a heater embedded in the recess, wherein the heater includes an upper portion and a lower portion, a width of the upper portion equals to the width of the inlet of the recess, and a width of the lower portion equals to the width of the bottom portion of the recess;

an auxiliary electrode extended from the upper portion of the heater and having a width the same as a width of the upper portion; and a second electrode positioned over the heater.

2. The phase change memory according to claim 1, further comprising a barrier layer surrounding a sidewall of the phase change element and a sidewall of the auxiliary electrode.

3. The phase change memory according to claim 1, wherein a depth of the recess is defined by a distance from the inlet of the recess to the bottom portion of the recess, and the depth is from 30 nm to 70 nm.

4. The phase change memory according to claim 1, wherein a ratio of the width of the inlet of the recess to the width of the bottom portion of the recess is about 1.2 to about 9.

5. A method of manufacturing a phase change memory, comprising:

forming a first dielectric layer, at least one conductive contact and at least one first electrode over a semiconductor substrate, wherein the first electrode is stacked on the conductive contact, and the first electrode has a top surface exposed from the first dielectric layer;

forming a second dielectric layer having at least one opening over the first dielectric layer, wherein the opening exposing the top surface of the first electrode;

forming a barrier layer lining a sidewall of the opening;

forming a phase change element in the opening, wherein the phase change element includes:

a base in contact with the top surface of the first electrode; and a peripheral wall extending upwards along the barrier layer from a periphery of the base, and an inner side of the peripheral wall defines a recess having an inlet and a bottom portion, wherein the inlet has a width that is greater than a width of the bottom portion;

forming a heater filled in the recess, wherein the heater has an upper portion and a lower portion, and the upper portion has a width greater than a width of the lower portion, wherein forming the heater comprises forming an auxiliary electrode extended from the upper portion of the heater and has a width the same as a width of the upper portion; and forming a second electrode over the heater.

6. The method according to claim 5, wherein forming the phase change element in the opening comprising:

depositing a phase change material layer in the opening and over the second dielectric layer, wherein the phase change material layer envelops a hollow space in the opening;

removing the phase change material layer deposited over the second dielectric layer; and etching away a portion of the phase change material layer in the opening to expose the hollow space, thereby forming the recess.

7. The method according to claim 5, wherein in the step of forming the barrier layer lining the sidewall of the opening, the top surface of the first electrode is exposed out of the barrier layer.

8. A method of manufacturing a phase change memory, comprising:

forming a first dielectric layer, at least one conductive contact and at least one first electrode over a semiconductor substrate, wherein the first electrode is stacked on the conductive contact, and the first electrode has a top surface exposed from the first dielectric layer;

forming a second dielectric layer having at least one opening over the first dielectric layer, wherein the opening exposing the top surface of the first electrode;

forming a barrier layer lining a sidewall of the opening, wherein the top surface of the first electrode is exposed out of the barrier layer;

forming a phase change element in the opening, wherein the phase change element includes:

a base in contact with the top surface of the first electrode; and a peripheral wall extending upwards along the barrier layer from a periphery of the base, and an inner side of the peripheral wall defines a recess having an inlet and a bottom portion, wherein the inlet has a width that is greater than a width of the bottom portion;

wherein forming the phase change element comprising:

depositing a phase chance material layer in the opening and over the second dielectric layer, wherein the phase change material layer envelops a hollow space in the opening;

removing the phase change material layer deposited over the second dielectric layer; and etching away a portion of the phase change material layer in the opening to expose the hollow space, thereby forming the recess;

forming a heater filled in the recess, wherein the heater has an upper portion and a lower portion, and the upper portion has a width greater than a width of the lower portion; and forming a second electrode over the heater.

9. The method according to claim 8, wherein forming the barrier layer lining the sidewall of the opening comprising:

depositing a barrier material layer over the second dielectric layer, the sidewall, and the top surface of the first electrode; and removing portions of the barrier material layer deposited on the second dielectric layer and on the top surface.

10. The method according to claim 8, wherein the width of the inlet of the recess is from 30 nm to 100 nm, the width of the bottom portion of the recess is from 12 nm to 30 nm.

11. The method according to claim 8, wherein a ratio of the width of the inlet of the recess to the width of the bottom portion of the recess is about 1.2 to about 9.

12. The method according to claim 8, wherein a depth of the recess is defined by a distance from the inlet of the recess to the bottom portion of the recess, and the depth is from 30 nm to 70 nm.

13. The method according to claim 8, wherein the width of the upper portion of the heater equals the width of the inlet of the recess, and the width of the lower portion of the heater equals the width of the bottom portion of the recess.

14. The method according to claim 8, wherein forming the heater comprising forming an auxiliary electrode, wherein the auxiliary electrode is extended from the upper portion of the heater and has a width the same as a width of the upper portion.

15. The method according to claim 8, wherein forming the second electrode comprising:

forming a third dielectric layer over the heater, wherein the third dielectric layer has a first aperture exposing the heater; and forming the second electrode in the first aperture.

* * * * *